United States Patent
Fukada

(10) Patent No.: US 7,528,429 B2
(45) Date of Patent: May 5, 2009

(54) FERROELECTRIC CAPACITOR AND SEMICONDUCTOR DEVICE

(75) Inventor: Shinichi Fukada, Hamura (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/612,885

(22) Filed: Dec. 19, 2006

(65) Prior Publication Data

US 2007/0138521 A1  Jun. 21, 2007

(30) Foreign Application Priority Data

Dec. 20, 2005  (JP) .............................. 2005-366926

(51) Int. Cl.
*H01L 27/108* (2006.01)

(52) U.S. Cl. .................... 257/295; 257/532; 438/3; 438/253; 438/396

(58) Field of Classification Search ................ 257/295, 257/532, 310; 438/3, 240, 253, 295, 396
See application file for complete search history.

(56) References Cited

U.S. PATENT DOCUMENTS

| | | | | |
|---|---|---|---|---|
| 5,838,035 A | * | 11/1998 | Ramesh | 257/295 |
| 6,077,716 A | * | 6/2000 | Yoo | 438/3 |
| 6,627,518 B1 | * | 9/2003 | Inoue et al. | 438/458 |
| 6,730,949 B2 | * | 5/2004 | Kishi et al. | 257/295 |
| 6,958,504 B2 | * | 10/2005 | Nakagawa et al. | 257/295 |
| 2005/0263809 A1 | * | 12/2005 | Natori et al. | 257/295 |
| 2006/0043452 A1 | * | 3/2006 | Ueda et al. | 257/310 |
| 2006/0046318 A1 | * | 3/2006 | Ueda et al. | 438/3 |
| 2007/0054038 A1 | * | 3/2007 | Kijima et al. | 427/126.1 |

FOREIGN PATENT DOCUMENTS

| | | |
|---|---|---|
| JP | 2000-040799 | 2/2000 |
| JP | 2000040799 A  * | 2/2000 |

* cited by examiner

*Primary Examiner*—Matthew Smith
*Assistant Examiner*—Colleen E Rodgers
(74) *Attorney, Agent, or Firm*—Harness, Dickey & Pierce, P.L.C.

(57) ABSTRACT

A ferroelectric capacitor includes: a base substrate; a first electrode provided above the base substrate; a ferroelectric layer provided above the first electrode; a conductive film provided on the ferroelectric layer; a sacrificial layer composed of dielectric material provided above the conductive film; and a second electrode provided above the sacrificial layer.

6 Claims, 2 Drawing Sheets

FERROELECTRIC CAPACITOR AND SEMICONDUCTOR DEVICE

The entire disclosure of Japanese Patent Application No.2005-366926, filed Dec. 20, 2005 is expressly incorporated by reference herein.

BACKGROUND

1. Technical Field

The present invention relates to ferroelectric capacitors and semiconductor devices.

2. Related Art

A ferroelectric memory device (FeRAM) is a nonvolatile memory that is capable of low voltage and high speed operations, and its memory cell can be composed of one transistor and one capacitor (1T/1C), such that an integration to the level of DRAM is possible. Accordingly, ferroelectric memory devices are highly expected as large capacity nonvolatile memories. In order to have a ferroelectric capacitor composing a ferroelectric memory device exhibit its ferroelectric characteristics to its maximum, the crystal orientation of each of the layers composing the ferroelectric capacitor is very important. An example of related art is described in Japanese laid-open patent application JP-A-2000-40799.

In a ferroelectric capacitor composed of a ferroelectric layer formed by a metal organic chemical vapor deposition (MOCVD) method and upper and lower electrodes interposing the ferroelectric layer and formed by a sputter method, adhesion at an interface between the ferroelectric layer and the upper electrode may be poor. Also, an upper layer of the ferroelectric layer may be damaged as a result of the sputtering, and its nonconductive property may be damaged. This is one of the causes that generate a leakage current in the ferroelectric capacitor.

SUMMARY

In accordance with an advantage of some aspects of the present invention, it is possible to provide ferroelectric capacitors whose leakage current is suppressed, and reliability and characteristics are improved. In accordance with another advantage of the aspects of the present invention, there are provided semiconductor devices that include ferroelectric capacitors whose characteristics are improved.

(1) A ferroelectric capacitor in accordance with an embodiment of the invention includes: a base substrate; a first electrode provided above the base substrate; a ferroelectric layer provided above the first electrode; a conductive film provided on the ferroelectric layer; a sacrificial layer composed of dielectric material provided above the conductive film; and a second electrode provided above the sacrificial layer.

In the ferroelectric capacitor in accordance with the embodiment described above, the conductive film is provided on the ferroelectric layer. Therefore, polarization charge generated at an interface of the ferroelectric layer can be collected in the conductive film. The sacrificial layer is composed of dielectric material, and its nonconductivity may not be uniform throughout the film, and may partly have portions with lower nonconductivity (hereafter referred to as "leak points"). The charge collected in the conductive film reaches the second electrode through the leak points. By this, polarization charge can be readily collected, and therefore saturation characteristics on voltage application of the spontaneous polarization can be improved. As a result, a ferroelectric capacitor with excellent characteristics which can achieve low voltage driving can be provided.

It is noted that, in the invention, a specific layer B (hereafter referred to as a "layer B") provided above a specific layer A (hereafter referred to as a "layer A") includes a case in which a layer B is directly provided on a layer A, and a case in which a layer B is provided over a layer A through another layer.

The ferroelectric capacitor in accordance with the embodiment of the invention can be modified as follows.

(2) In the ferroelectric capacitor in accordance with an aspect of the embodiment of the invention, the sacrificial layer may have a nonconductive property lower than the characteristic nonconductive property of the dielectric material.

According to the aspect of the embodiment described above, leak points of the sacrificial layer can be more reliably secured, and polarization charge collected in the conductive film can more effectively reach the upper electrode.

(3) In the ferroelectric capacitor in accordance with an aspect of the embodiment of the invention, the dielectric material may be the same material that composes the ferroelectric layer.

According to the embodiment described above, lattice mismatch at the interface between the sacrificial layer and the ferroelectric layer can be alleviated, such that the ferroelectric layer with good film quality can be formed.

(4) In the ferroelectric capacitor in accordance with an aspect of the embodiment of the invention, the sacrificial layer has a film thickness between 5 nm and 20 nm.

(5) In the ferroelectric capacitor in accordance with an aspect of the embodiment of the invention, the conductive film may be in the form of islands.

According to the embodiment described above, the conductive film is composed of discontinuous films, and therefore almost no stress is generated, and the ferroelectric layer would not be strained. For this reason, the nonconductive property of the ferroelectric layer is maintained, and generation of leakage current is suppressed.

(6) In the ferroelectric capacitor in accordance with an aspect of the embodiment of the invention, the conductive film may be composed of at least one material selected from the group consisting of Pt, Ir, Au, Os, In, Sn, Ru and W, or an oxide thereof.

(7) In the ferroelectric capacitor in accordance with an aspect of the embodiment of the invention, the sacrificial layer may have a smaller film thickness compared to the ferroelectric layer.

(8) In the ferroelectric capacitor in accordance with an aspect of the embodiment of the invention, the film thickness of the conductive film may be 5 nm or less.

(9) A semiconductor device in accordance with an embodiment of the invention includes: a semiconductor substrate; a dielectric layer provided above the semiconductor substrate; a plug that penetrates the dielectric layer; a first electrode provided at least on the plug; a ferroelectric layer provided above the first electrode; a conductive film provided on the ferroelectric layer; a sacrificial layer composed of dielectric material provided above the conductive film; and a second electrode provided above the sacrificial layer.

In the semiconductor device in accordance with the embodiment described above, the ferroelectric capacitor is provided with the conductive film and the sacrificial layer between the ferroelectric layer and the second electrode. For this reason, polarization charge can be effectively collected in the second electrode as described above, and the semiconductor device with a stacked structure that includes a ferroelectric capacitor with excellent characteristics can be provided.

DESCRIPTION OF EXEMPLARY EMBODIMENTS

Examples of preferred embodiments of the invention are described below with reference to the accompanying drawings.

1. Ferroelectric Capacitor

Figure 1:
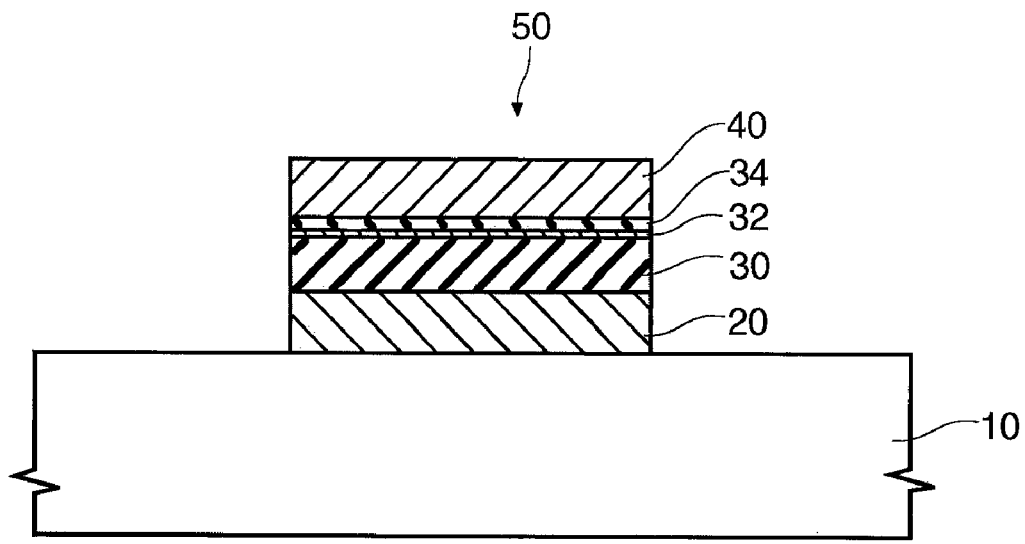
FIG. 1 is a schematic cross-sectional view of a ferroelectric capacitor in accordance with an embodiment of the invention.

First, a ferroelectric capacitor in accordance with an embodiment of the invention is described with reference to FIG. 1. FIG. 1 is a cross-sectional view of a ferroelectric capacitor 50 in accordance with the present embodiment.

The ferroelectric capacitor 50 includes a base substrate 10, a lower electrode (first electrode) 20, a ferroelectric layer 30, a conductive film 32, a sacrificial layer 34 and an upper electrode (second electrode) 40.

The semiconductor substrate having the insulator film on a surface thereof. A plurality of transistors (not shown) may be formed in the base substrate 10.

The lower electrode 20 and the upper electrode 40 may be formed from, for example, Pt, Ir, Ir oxide (Ir $O_x$), Ru, Ru oxide (Ru$O_x$), SrRu compound oxide (SrRu$O_x$) or the like. Each of the lower electrode 20 and the upper electrode 40 may be formed from a single layer or a plurality of layers.

The ferroelectric layer 30 may be formed with PZT system ferroelectrics composed of oxides that include Pb, Zr, Ti as composing elements. Alternatively, Pb (Zr, Ti, Nb)$O_3$ (PZTN system) ferroelectrics in which Nb is doped at the Ti site may be used. It is noted that the ferroelectric layer 30 is not limited to the materials listed above, and any of SBT system, BST system, BIT system, and BLT system ferroelectrics can be applied.

The conductive film 32 may be composed of a high melting point conductive material. The high melting point conductive material may be at least one kind selected from the group consisting of, for example, Pt, Ir, In, Au, Ox, In, Sn, Ru and W, or its oxide. The conductive film 32 may preferably have a film thickness that allows the conductive film 32 to exist as a continuous film or greater, but 5 nm or less. This is because, when the film thickness of the conductive film 32 is 5 nm or less, the conductive film 32 is influenced by the surface morphology of the ferroelectric layer 30, and strain would not be generated in the conductive film 32. If stress is generated, strain of the ferroelectric layer 30 is given by the conductive film 32, which may lead to deterioration of its crystallinity.

The sacrificial layer 34 is a layer composed of dielectric material. More concretely, the sacrificial layer 34 is a layer having a lower degree of nonconductivity compared to the characteristic nonconductivity peculiar to the dielectric material, and may be a layer composed of dielectric material that is intentionally deteriorated. In other words, the sacrificial layer 34 is a layer that includes more leak points. As the sacrificial layer 34, for example, a layer having a perovskite structure may be used. More concretely, a PZT layer may be exemplified.

The sacrificial layer 34 has a film thickness relatively smaller than that of the ferroelectric layer 30. More concretely, the film thickness of the sacrificial layer 34 may be between 5 nm and 20 nm. If the film thickness of the sacrificial layer 34 is less than 5 nm, a layer that is continuous in a plane cannot be formed, and the conductive film 32 may be exposed. On the other hand, if the film thickness of the sacrificial layer 34 exceeds over 20 nm, the layer could be considered as a high resistance layer, and disadvantageous effects similar to those that occur when the characteristics of the ferroelectric capacitor 50 are deteriorated may occur. The sacrificial layer 34 may preferably be 10 nm or less.

In the ferroelectric capacitor 50 in accordance with the present embodiment, the conductive film 32 is provided on the ferroelectric layer 30. Therefore, polarization charge generated at the interface of the ferroelectric layer 30 can be collected in the conductive film 32. The sacrificial layer 34 is composed of dielectric material, and its nonconductivity is not uniform throughout the film, and areas having lower nonconductivity (hereafter also referred to as "leak points") exist in part in the conductive film 32. Charge collected in the conductive film 32 reaches the second electrode 40 through the leak points.

In the case of a ferroelectric capacitor having a structure in which an upper electrode is directly provided on a ferroelectric layer, when the upper electrode is formed by a sputtering method, physical damages may be inflicted on the ferroelectric layer. This lowers the nonconductivity of the ferroelectric layer and causes a leak current to be generated. Also, the surface morphology of the ferroelectric layer would be deteriorated, such that the contact area between the ferroelectric layer and the upper electrode may be reduced, which leads to deterioration of saturation characteristics on voltage application of the spontaneous polarization. However, in the ferroelectric capacitor 50 in accordance with the present embodiment, the conductive film 32 is a thin film, and therefore damages that may be inflicted on the ferroelectric layer 30 at the time of forming the conductive film 32 would be smaller, compared to the case of forming the upper electrode 40. Accordingly, the conductive film 32 can secure a contact area with the ferroelectric layer 30, and can be formed in a state with a few damages to the ferroelectric layer 30. Consequently, more polarization charge can be collected in the conductive film 32, and the collected polarization charge can reach the upper electrode 40 because the sacrificial layer 34 having deteriorated nonconductivity is provided on the conductive film 32. By this, compared to a ferroelectric capacitor having an upper electrode directly provided on a ferroelectric layer, polarization charge can be more effectively collected in accordance with the embodiment. As a result, the ferroelectric capacitor 50 with excellent characteristics, which has improved saturation characteristics on voltage application of the spontaneous polarization, and realizes low-voltage driving, can be provided.

2. Method for Manufacturing Ferroelectric Capacitor

Figure 2:
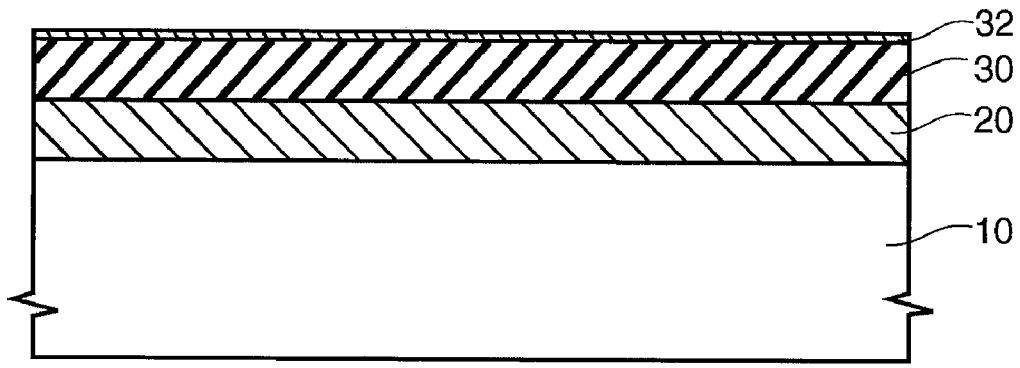
FIG. 2 is a schematic cross-sectional view showing a step of a method for manufacturing a ferroelectric capacitor in accordance with an embodiment of the invention.
Figure 3:
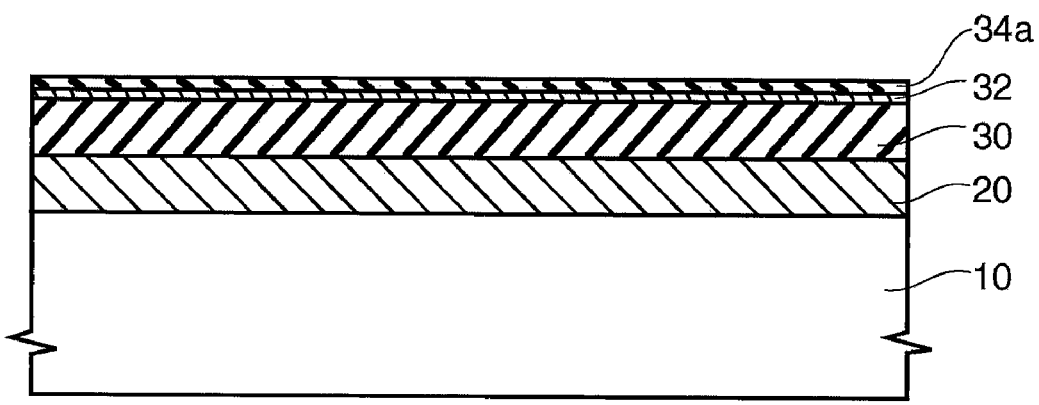
FIG. 3 is a schematic cross-sectional view showing a step of the method for manufacturing a ferroelectric capacitor in accordance with the embodiment of the invention.
Figure 4:
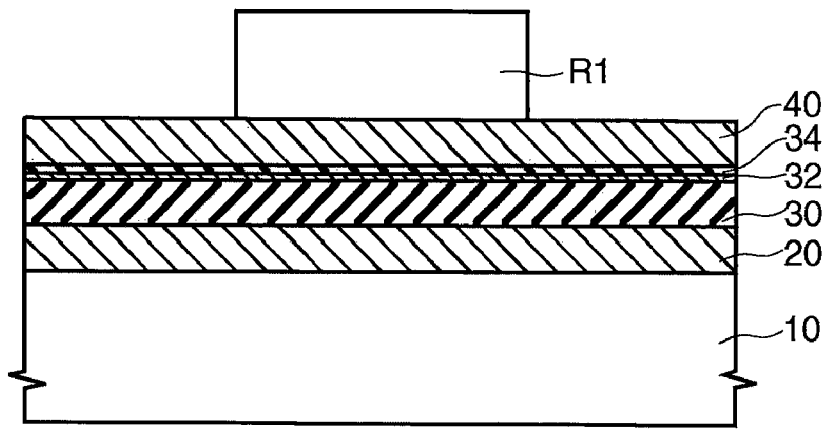
FIG. 4 is a schematic cross-sectional view showing a step of the method for manufacturing a ferroelectric capacitor in accordance with the embodiment of the invention.

Next, a method for manufacturing a ferroelectric capacitor 50 in accordance with an embodiment of the invention is described with reference to FIGS. 2 through 4. FIGS. 2 through 4 are schematic cross-sectional views of the ferroelectric capacitor in accordance with the embodiment of the invention.

(1) First, as shown in FIG. 2, a base substrate 10 is prepared. The semiconductor substrate having the insulator film on a surface there of. Next, a first electrode (lower electrode) 20 is formed above the base substrate 10. The lower electrode 20 may be formed by a sputter method or a MOCVD method. In addition, a vacuum deposition method, a CVD method or the like can be applied. The ferroelectric layer 30 may be formed by a solution coating method (including a sol-gel method, a MOD (metal organic decomposition) method, etc.), a sputter method, a CVD method or the like.

Then, a conductive film 32 is formed. The conductive film 32 may be formed by, for example, a sputter method using the material described above as a target.

(2) Next, as shown in FIG. 3, a sacrificial layer 34 is formed on the conductive film 32. First, a dielectric layer 34a that becomes to be the sacrificial layer 34 is formed on the conductive film 32. When the dielectric film 34a is formed with, for example, the same material as that of the ferroelectric layer 30, a like forming method can be applied.

(3) Next, as shown in FIG. 4, an upper electrode 40 can be formed on the dielectric layer 34a. The upper electrode 40 may be formed by, for example, a sputter method. In this step, the dielectric layer 34a is damaged by the sputtering, and becomes the sacrificial layer 34 with lowered nonconductivity.

Then, on the laminated layers, for example, a resist layer R1 is formed. The resist layer R1 may be formed by using a photolithography technique.

(4) Next, as shown in FIG. 1, portions of the laminated layers which are not covered by the resist layer R1 are removed. The removal of the laminated layers can be conducted by using a known etching technique. The laminated layers are patterned, thereby forming a ferroelectric capacitor 50, and then an anneal treatment is conducted in an oxygen atmosphere for stabilization of the ferroelectric layer 30 (for example, for recovering the layer from etching damages)

By the steps described above, the ferroelectric capacitor in accordance with the present embodiment can be manufactured.

MODIFIED EXAMPLES

Figure 5:
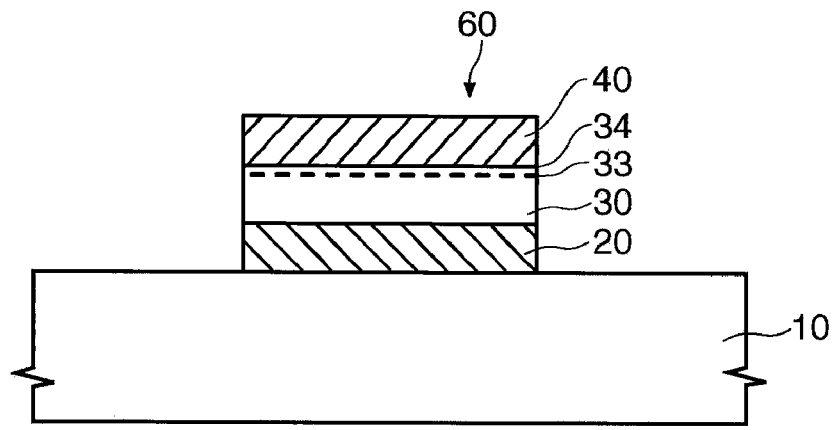
FIG. 5 is a schematic cross-sectional view of a ferroelectric capacitor in accordance with a modified example of the embodiment.

Next, a ferroelectric capacitor 60 in accordance with a modified example of the embodiment of the invention is described with reference to FIG. 5. FIG. 5 is a schematic cross-sectional view of the ferroelectric capacitor 60 in accordance with the modified example. The modified example has a conductive film 33 that is different from the embodiment described above. It is noted that, in the following description, features different from the embodiment described above are described.

In the ferroelectric capacitor 60 in accordance with the modified example, a conductive film 33 is provided between a ferroelectric layer 30 and a sacrificial layer 34. The conductive film 33 is not a continuous film that covers the entire surface of the ferroelectric layer 30, but is formed in the form of islands. In other words, after forming the conductive film 33, portions of the ferroelectric layer 30 are exposed at places as viewed in a plan view. The conductive film 33 may preferably have island sections uniformly distributed throughout in a plane. The island sections may be in the form of lattices or networks in a plane.

In the ferroelectric capacitor 60 in accordance with the present modified example, the conductive film 33 is a discontinuous film, such that any stress is hardly generated, and the ferroelectric layer 30 would not be strained. Therefore, the nonconductivity of the ferroelectric layer 30 is maintained, and generation of leakage current can be suppressed. Also, when the sacrificial layer 34 and the ferroelectric layer 30 are formed with the same material, the sacrificial layer 34 and the ferroelectric layer 30 directly contact with each other through gaps between the island sections 33a, whereby lattice mismatch can be better alleviated. For this reason, the crystallinity of the ferroelectric layer 30 would not be deteriorated, and the ferroelectric capacitor 60 with excellent characteristics can be provided.

Next, a method for manufacturing the ferroelectric capacitor 60 in accordance with the modified example is described. It is noted that detailed description of the steps in the manufacturing method of the present modified example which may be conducted in a similar manner as those of the manufacturing method described above shall be omitted.

First, according to the manufacturing step (1) of the embodiment described above, a lower electrode 20 is formed on a base substrate 10. Then a ferroelectric layer 30 is formed on the lower electrode 20, and a conductive layer 33 is formed on the ferroelectric layer 30. As the conductive film 33, for example, Ir or $IrO_x$ may be used. In this case, by conducting a process with a condition to obtain a film thickness of 2 nm or less, island sections 33a can be formed dispersed in a plane. In particular, when a PZT system material is used as the ferroelectric layer 30, and Ir or $IrO_x$ is used as the conductive film 33, adhesion between the two layers is not very good, such that the island sections 33a would more readily be formed. Also, in order to promote formation of the island sections 33a, the conductive film 33 may preferably be formed under a condition in which migration is accelerated. Such a condition may be created by a high-temperature sputter method. As the material of the conductive film 33, a material with which the island sections 33a can be readily formed can be appropriately selected in consideration of the material of the ferroelectric layer 30.

Then, according to the manufacturing step (2) of the manufacturing method described above, a dielectric layer 34a that becomes to be a sacrificial layer 34 is formed on the conductive film 33. In the modified example, the surface on which the dielectric layer 34a is to be formed does not have a uniform surface condition. In other words, the island sections 33a are present at places, and the ferroelectric layer 30 is exposed at places where the island sections 33a do not exist. Therefore, although the dielectric layer 34a that is formed on the ferroelectric layer 30 has good crystallinity (that reflects the crystallinity of the ferroelectric layer 30), but the dielectric layer 34a that is formed on the island sections 33a becomes a new starting point of crystal growth in random orientations. As a result, a layer having small crystal grains, but large crystal grain boundaries can be formed. This contributes to an increase in leak points, whereby the reduction in nonconductivity required for the sacrificial layer 34 can be achieved with a relatively simple method.

Then, by conducting the manufacturing steps (3) and (4) of the embodiment described above, the ferroelectric capacitor 60 in accordance with the modified example can be formed.

3. Semiconductor Device

Figure 6:
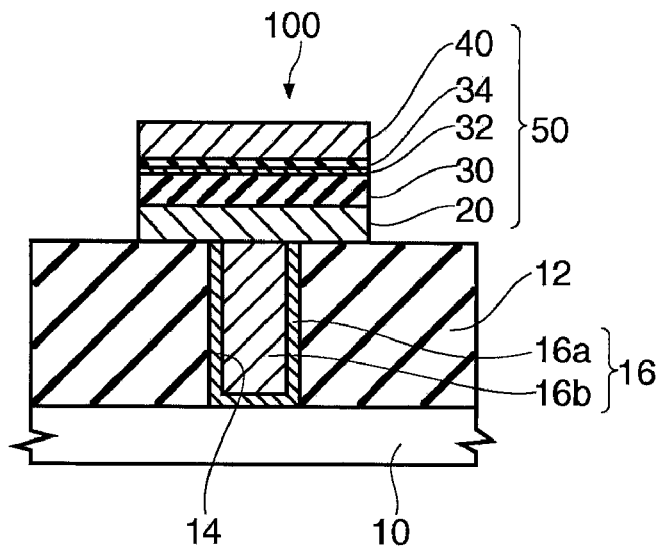
FIG. 6 is a schematic cross-sectional view of a semiconductor device in accordance with an embodiment of the invention.

A semiconductor device in accordance with an embodiment of the invention is descried with reference to FIG. 6. FIG. 6 is a schematic cross-sectional view of a semiconductor device 100 in accordance with the present embodiment. The semiconductor device 100 of the present embodiment uses a structure in which a ferroelectric capacitor 50 is stacked over a selection transistor, compared to the embodiment described above. It is noted that the semiconductor device 100 in accordance with the present embodiment includes the ferroelectric capacitor in accordance with the previous embodiment described above.

As shown in FIG. 6, the semiconductor device 100 in accordance with the present embodiment includes a base substrate 10, a dielectric layer 12, a contact hole 14, a contact section 16, and a ferroelectric capacitor 50.

The base substrate 10 may be a semiconductor substrate (for example a silicon substrate). A plurality of transistors (not shown) may be formed in the base substrate 10. Each of the transistors includes impurity regions that become to be source and drain regions, respectively, a gate dielectric layer, and a gate electrode. An element isolation region (not shown) is formed between adjacent ones of the transistors, thereby providing electrical insulation among the transistors. The semiconductor device in accordance with the present embodiment has, for example, a 1T1C type stacked structure.

The dielectric layer 12 is formed on the base substrate 10. The dielectric layer 12 is formed from at least one of, for example, a silicon oxide layer ($SiO_2$ layer), a silicon nitride layer (SiN layer), and a silicon oxinitride layer (SiON layer), and can be made of a single layer or a plurality of layers.

The contact hole 14 penetrates the dielectric layer 12. The contact section 16 having electrical conductivity is formed inside the contact hole 14.

The contact section 16 is formed extending in a direction perpendicular to the base substrate 10, and penetrates the dielectric layer 12. One end of the contact layer 16 is electrically connected to the transistor (one of the source region and the drain region of the transistor) in the base substrate 10, and the other end of the contact section 16 is electrically connected to the ferroelectric capacitor 50. In other words, the contact section 16 electrically connects the transistor with the ferroelectric capacitor 50. The contact section 16 is composed of a barrier layer 16a provided along an inner surface of the contact hole 14, and a plug 16b that fills in the contact hole 14.

The ferroelectric capacitor 50 has substantially the same structure described in the previous embodiment described above.

By the semiconductor device in accordance with the present embodiment, even when a ferroelectric memory in a stacked structure is used, a semiconductor device with excellent characteristics, which can suppress generation of leakage current and improve saturation characteristics on voltage application of the spontaneous polarization, can be provided.

In particular, when the stacked structure is used, processings at high temperatures cannot be applied, because transistors and other elements may be formed in a lower layer prior to forming the ferroelectric capacitor 50. For this reason, a MOCVD method may be used as the method for forming the ferroelectric layer 30. However, if the upper electrode 40 is formed by a sputter method, the ferroelectric layer 30 that is formed by a MOCVD method may have a leaky surface as the surface is damaged. As a result, in a miniaturized semiconductor device (when the film thickness of the ferroelectric layer 30 is small), the ferroelectric capacitor may be placed in a state that cannot be normally operated. However, according to the semiconductor device in accordance with the present embodiment, such problems would not occur, and the semiconductor device can be provided with improved reliability.

It is noted that the invention is not limited to the embodiments described above, and many modifications can be made. For example, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A ferroelectric capacitor comprising:
   a base substrate;
   a first electrode provided above the base substrate;
   a ferroelectric layer provided above and in direct contact with the first electrode and, wherein ferroelectric layer is operable to provide memory functionality;
   a conductive film a) is composed of at least one material selected from a group consisting of Pt, Ir, Au, Os, In, Sn, Ru and W, or an oxide thereof and b) provided on the ferroelectric layer, wherein the conductive film has a film thickness of 5 nm or less and such that the conductive film is influenced by surface morphology of the ferroelectric layer to prevent strain from being generated in the conductive film;
   a sacrificial layer composed of dielectric material provided above and in direct contact with the conductive film, wherein the sacrificial layer has a film thickness between 5 nm and 20 nm and is deteriorated such that the sacrificial has a plurality of leak points that each have a lower degree of nonconductivity compared to a characteristic nonconductivity of the dielectric material and that allow polarization charges collected by the conductive film to reach the second electrode; and
   a second electrode provided above the sacrificial layer.

2. The ferroelectric capacitor according to claim 1, wherein the dielectric material is the same material that composes the ferroelectric layer.

3. The ferroelectric capacitor according to claim 1, wherein the conductive film has a shape of islands.

4. The ferroelectric capacitor according to claim 1, wherein the sacrificial layer has a smaller film thickness compared to the ferroelectric layer.

5. The ferroelectric capacitor according to claim 1, wherein the film thickness of the conductive film is 5 nm or less.

6. A semiconductor device comprising:
   a semiconductor substrate;
   a dielectric layer provided above the semiconductor substrate;
   a plug that penetrates the dielectric layer;
   a first electrode provided at least on the plug;
   a ferroelectric layer provided above and in direct contact with the first electrode and, wherein ferroelectric layer is operable to provide memory functionality;
   a conductive film a) is composed of at least one material selected from a group consisting of Pt, Ir, Au, Os, In, Sn, Ru and W. or an oxide thereof and b) provided on the ferroelectric layer, wherein the conductive film has a film thickness of 5 nm or less and such that the conductive film is influenced by surface morphology of the ferroelectric layer to prevent strain from being generated in the conductive film;
   a sacrificial layer composed of dielectric material provided above and in direct contact with the conductive film, wherein the sacrificial layer has a film thickness between 5 nm and 20 nm and is deteriorated such that the sacrificial has a plurality of leak points that each have a lower degree of nonconductivity compared to a characteristic nonconductivity of the dielectric material and that allow polarization charges collected by the conductive film to reach the second electrode; and a second electrode provided above the sacrificial layer.

* * * * *